(12) United States Patent
Wen et al.

(10) Patent No.: US 10,522,968 B2
(45) Date of Patent: Dec. 31, 2019

(54) NARROW LINEWIDTH MULTI-WAVELENGTH LIGHT SOURCES

(71) Applicant: Futurewei Technologies, Inc., Plano, TX (US)

(72) Inventors: Yangjing Wen, Cupertino, CA (US); Yusheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 185 days.

(21) Appl. No.: 15/852,693

(22) Filed: Dec. 22, 2017

(65) Prior Publication Data

US 2019/0199057 A1   Jun. 27, 2019

(51) Int. Cl.
*H01S 5/00* (2006.01)
*H01S 5/40* (2006.01)
(Continued)

(52) U.S. Cl.
CPC ........ *H01S 5/0078* (2013.01); *G02B 6/29382* (2013.01); *G02B 6/4215* (2013.01); *H01S 5/4012* (2013.01); *H01S 5/4087* (2013.01); *G02B 6/12009* (2013.01); *G02B 6/29338* (2013.01); *G02B 6/29389* (2013.01);
(Continued)

(58) Field of Classification Search
None
See application file for complete search history.

(56) References Cited

U.S. PATENT DOCUMENTS 6,570,893 B1   5/2003   Libatique et al.

8,831,047 B1   9/2014   Qureshi
(Continued)

FOREIGN PATENT DOCUMENTS

| CN | 1497894 A | 5/2004 |
|---|---|---|
| CN | 102882601 A | 1/2013 |

(Continued)

OTHER PUBLICATIONS

Riemensberger et al., "Dispersion Engineering of Thick High-Q Silicon Nitride Ring-Resonators Via Atomic Layer Deposition", Optical Society of America, Nov. 29, 2012, vol. 20, No. 25, Optics Express 27661.

(Continued)

*Primary Examiner* — Jerry Rahll
(74) *Attorney, Agent, or Firm* — Vierra Magen Marcus LLP

(57) ABSTRACT

Narrow linewidth multi-wavelength (MW) light sources and related methods are disclosed. Such a light source includes gain chips coupled to a wavelength combiner and reflection chip that includes phase control sections (PCSs), a wavelength division multiplexer (WDM), and a micro-ring resonator (MRR) based reflector. The WDM combines light beams received from the gain chips, via the PCSs, into a combined light beam. The MRR based reflector receives the combined light beam and generates both a reflection MW light beam and a transmission MW light beam. The WDM receives the reflection MW light beam, separates it into different wavelengths, and provides each different wavelength of light via a respective one of the PCSs to a respective one of the gain chips to self seed an internal laser cavity thereof. The transmission MW light beam is, or is used to produce, the narrow linewidth MW light produced by the light source.

20 Claims, 7 Drawing Sheets

(51) Int. Cl.
  *G02B 6/293* (2006.01)
  *G02B 6/42* (2006.01)
  *G02B 6/12* (2006.01)

(52) U.S. Cl.
  CPC .............. *G02B 2006/12126* (2013.01); *G02B 2006/12147* (2013.01)

(56) References Cited

U.S. PATENT DOCUMENTS

| | | |
|---|---|---|
| 2004/0067059 A1 | 4/2004 | Song et al. |
| 2012/0163821 A1 | 6/2012 | Kwon et al. |
| 2014/0185980 A1 | 7/2014 | Lei et al. |

FOREIGN PATENT DOCUMENTS

| | | |
|---|---|---|
| CN | 104617472 A | 5/2015 |
| CN | 106329297 A | 1/2017 |
| CN | 206710650 U | 12/2017 |

OTHER PUBLICATIONS

Doerr, "Direct Modulation of Long-Cavity Semiconductor Lasers", Journal of Lightwave Technology, Sep. 1996, vol. 14, Issue 9.

Pu et al., "Efficient Frequency Comb Generation in Algaas-On-Insulator", Optical Society of America, Aug. 2016, vol. 3, No. 8, Optica, pp. 823-826.

Zirngibl et al., "An 18-Channel Multifrequency Laser", IEEE Photonics Technology Letters, Jul. 1996, vol. 8, No. 7, pp. 870-872.

Doerr et al., "Single Longitudinal-Mode Stability Via Wave Mixing in Long-Cavity Semiconductor Lasers", IEEE Photonics Technology Letters, Sep. 1995, vol. 7, No. 9, pp. 962-964.

Zhao et al., "Narrow-Linewidth Widely Tunable Hybrid External Cavity Laser Using Si3N4/Sio2 Microring Resonators", IEEE, Aug. 2016, pp. 24-25.

Kita et al., "Narrow Spectral Linewidth Silicon Photonic Wavelength Tunable Laser Diode for Digital Coherent Communication System", IEEE Journal of Selected Topics in Quantum Electronics, Nov. 2016, vol. 22, No. 6, 1500612.

International Search Report dated Mar. 22, 2019 in PCT Application No. PCT/CN2018/122538, 13 pages.

NARROW LINEWIDTH MULTI-WAVELENGTH LIGHT SOURCES

FIELD

The disclosure generally relates to multi-wavelength light sources, and in particular, to narrow linewidth multi-wavelength light sources and methods for producing narrow linewidth multi-wavelength light.

BACKGROUND OF THE INVENTION

Multi-wavelength (MW) light sources with narrow linewidth are attractive for use in both coherent transmission systems and remote modulation systems. For example, a coherent transmission system requires a narrow linewidth light source when high order modulation, such as quadrature amplitude modulation (QAM), is being used to achieve high capacity. Currently available narrow linewidth light sources are costly to manufacture. Accordingly, narrow linewidth light sources increase the cost of coherent transmission systems, since narrow linewidth light sources are used as both optical carriers and local oscillators, and have been a barrier for coherent detection entering into the short reach market. In a remote modulation system, multiple optical carriers are remotely delivered to reflective type polarization insensitive modulators for data modulation. However, this kind of remote modulation system is susceptible to continuous wave (CW) reflection, where an optical carrier is reflected back by one or more fiber connectors and is combined with its returned optical signal and becomes in-band crosstalk. The impact of CW reflection can be suppressed by using a high pass filter at the receiver to remove the low frequency components generated by the beating of CW reflection and signal carrier. The narrow linewidth of a light source is beneficial to the suppression of the CW reflection. Accordingly, it would be beneficial to develop low-cost narrow linewidth multi-wavelength light sources, for use in both coherent optical transmission systems and remote modulation optical interconnect systems, but not limited thereto.

SUMMARY

According to one aspect of the present disclosure, there is provided, a light source that produces narrow linewidth multi-wavelength (MW) light, the light source comprising: a plurality of gain chips, each of which is configured to generate a light beam and each of which includes a laser cavity; and a wavelength combiner and reflection chip coupled to the plurality of gain chips and including: a plurality of phase control sections, each of which is coupled to a respective one of the gain chips; a wavelength division multiplexer (WDM) configured to combine the light beams received from the gain chips, via the phase control sections, into a combined light beam; and a micro-ring resonator (MRR) based reflector configured to receive the combined light beam from the WDM and generate both a reflection MW light beam and a transmission MW light beam; wherein the WDM is configured to receive the reflection MW light beam from the MRR based reflector, separate the reflection MW light beam into a plurality of different wavelengths of light, and provide each of the different wavelengths of light via a respective one of the phase control sections to a respective one of the gain chips; and wherein the transmission MW light beam generated by the MRR based reflector is the narrow linewidth MW light produced by the light source, or is used to produce the narrow linewidth MW light produced by the light source.

Optionally, in any of the preceding aspects, the wavelength combiner and reflector chip comprises a silicon-on-insulator (SOI) or planar lightwave circuit (PLC) chip; and each of the gain chips is either butt-coupled or evanescent-coupled to the SOI or PLC chip.

Optionally, in any of the preceding aspects, the MRR based reflector includes an optical coupler configured to split the combined light beam into a first combined light beam and a second combined light beam; and an add-drop MRR including first and second optical waveguides and an optical micro-ring positioned between the first and second optical waveguides.

Optionally, in any of the preceding aspects, the add-drop MRR has a free spectral range (FSR) equal to a channel spacing of the WDM or equal to a subharmonic of the channel spacing of the WDM.

Optionally, in any of the preceding aspects, the optical coupler of the MRR based reflector comprises a 2×2 optical coupler including first, second, third, and fourth ports; the first port of the 2×2 optical coupler is coupled to the WDM; the second port of the 2×2 optical coupler is coupled to the first optical waveguide of the add-drop MRR; the third port of the 2×2 optical coupler is coupled to the second optical waveguide of the add-drop MRR; and the fourth port of the 2×2 optical coupler outputs the transmission MW light beam generated by the MRR based reflector.

Optionally, in any of the preceding aspects: the first combined light beam is coupled into the add-drop MRR via the first optical waveguide, and the second combined light beam is coupled into the add-drop MRR via the second optical waveguide; the add-drop MRR generates, based on the first combined light beam, a first drop portion of MW light that is dropped to the second optical waveguide, and a first pass portion of MW light that passes through the add-drop MRR; the add-drop MRR generates, based on the second combined light beam, a second drop portion of MW light that is dropped to the first optical waveguide, and a second pass portion of MW light that passes through the add-drop MRR; and the first and second drop portions of the MW light are returned to the optical coupler and are combined to generate the reflection MW light beam and the transmission MW light beam.

Optionally, in any of the preceding aspects, the light source further comprises absorbers or dissipaters configured to absorb or dissipate the first and second pass portions of MW light that pass through the add-drop MRR.

Optionally, in any of the preceding aspects, the first combined light beam is coupled into the add-drop MRR via the first optical waveguide, and the second combined light beam is coupled into the add-drop MRR via the second optical waveguide; the add-drop MRR generates, based on the first combined light beam, a first drop portion of MW light that is dropped to the second optical waveguide, and a first pass portion of MW light that passes through the add-drop MRR; the add-drop MRR generates, based on the second combined light beam, a second drop portion of MW light that is dropped to the first optical waveguide, and a second pass portion of MW light that passes through the add-drop MRR; the first and second drop portions of MW light are returned to the optical coupler and are combined to generate the reflection MW light beam; and the MRR based reflector also includes a further optical coupler.

Optionally, in any of the preceding aspects, the optical coupler of the MRR based reflector comprises a first 1×2 optical coupler including first, second, and third ports; the further optical coupler of the MRR based reflector comprises a second 1×2 optical coupler including first, second, and third ports; the first port of the first 1×2 optical coupler of the MRR based reflector is coupled to the WDM; the second port of the first 1×2 optical coupler of the MRR based reflector is coupled to the first optical waveguide of the add-drop MRR; the third port of the first 1×2 optical coupler of the MRR based reflector is coupled to the second optical waveguide of the add-drop MRR; the first port of the second 1×2 optical coupler of the MRR based reflector outputs the transmission MW light beam generated by the MRR based reflector; the second port of the second 1×2 optical coupler of the MRR based reflector is coupled to the first optical waveguide optically downstream of the add-drop MRR; and the third port of the second 1×2 optical coupler of the MRR based reflector is coupled to the second optical waveguide optically downstream of the add-drop MRR.

Optionally, in any of the preceding aspects: the optical coupler of the MRR based reflector comprises a 1×2 optical coupler including first, second, and third ports; a further optical couple of the MRR based reflector comprises a 2×2 optical coupler including first, second, third, and fourth ports; the first port of the 2×2 optical coupler is coupled to the WDM; the second port of the 2×2 optical coupler is configured to output the combined light beam; the third port of the 2×2 optical coupler outputs the narrow linewidth MW light; the fourth port of the 2×2 optical coupler outputs further transmission MW light generated by the MRR based reflector, wherein the further transmission MW light comprises further narrow linewidth MW light output or is used to produce the further narrow linewidth MW light output, or is absorbed or dissipated; the first port of the 1×2 optical coupler is configured to receive the combined light beam to be split; the second port of the 1×2 optical coupler is coupled to the first optical waveguide of the add-drop MRR; and the third port of the 1×2 optical coupler is coupled to the second optical waveguide of the add-drop MRR.

Optionally, in any of the preceding aspects, the MRR based reflector includes: an add-drop MRR including first and second optical waveguides and an optical micro-ring positioned between the first and second optical waveguides; and a loop mirror including first and second ports; wherein the combined light beam from the WDM is coupled into the add-drop MRR via the first optical waveguide, and a portion of the combined light beam is dropped to the second optical waveguide and provided to the first port of the loop mirror; wherein the loop mirror returns MW light to the second optical waveguide, via the first port of the loop mirror, and the returned MW light is added to the optical ring of the add-drop MRR, and dropped to the first optical waveguide to produce the reflection MW light beam generated by the MRR based reflector; and wherein MW light that is output by the second port of the loop mirror is the transmission MW light generated by the MRR based reflector.

Optionally, in any of the preceding aspects, the add-drop MRR has a free spectral range (FSR) equal to a channel spacing of the WDM or equal to a subharmonic of the channel spacing of the WDM.

According to one aspect of the present disclosure, there is provided a method for producing narrow linewidth multi-wavelength (MW) light by a light source, comprising: generating a plurality of light beams by a plurality of gain chips; combining the plurality of light beams into a combined light beam; generating, based on the combined light beam, both a reflection MW light beam and a transmission MW light beam; separating the reflection MW light beam into a plurality of different wavelengths of light; providing each of the different wavelengths of light to a respective one of the gain chips; and outputting the narrow linewidth MW light based on the transmission MW light beam.

Optionally, in any of the preceding aspects, the method further comprises: controlling a phase of each the different wavelengths of light before they are provided to a respective one of the gain chips to thereby self seed the laser cavity of the respective one of the gain chips.

Optionally, in any of the preceding aspects, combining the plurality of light beams, and separating the reflection MW light beam, are performed using a wavelength division multiplexer (WDM).

Optionally, in any of the preceding aspects, generating both the reflection MW light beam and the transmission MW light beam is performed by a micro-ring resonator (MRR) based reflector including an add-drop MRR having a free spectral range (FSR) equal to a channel spacing of the WDM or equal to a subharmonic of the channel spacing of the WDM.

Optionally, in any of the preceding aspects, combining the plurality of light beams, generating both the reflection MW light beam and the transmission MW light beam, and separating the reflection MW light beam, are performed by components of a common chip to which the gain chips are coupled.

According to one aspect of the present disclosure, there is provided, a light source that produces narrow linewidth multi-wavelength (MW) light, the light source comprising: a plurality of gain chips; a plurality of phase control sections; a wavelength division multiplexer (WDM); and a micro-ring resonator (MRR) based reflector including one or more optical couplers and an add-drop MRR; the WDM coupled to each of the plurality of gain chips via a respective one of the plurality of phase control sections; the MRR based reflector configured to receive a combined light beam from the WDM and generate both a reflection MW light beam, which is returned to the WDM, and a transmission MW light beam, which is or is used to generate the narrow linewidth MW light.

Optionally, in any of the preceding aspects, each of the plurality of gain chips includes a laser cavity; and each the different wavelengths of light is provided via a respective one of the phase control sections to a respective one of the gain chips to self seed the laser cavity of the respective one of the gain chips.

Optionally, in any of the preceding aspects, the WDM comprises an arrayed waveguide grating.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION

Figure 1:
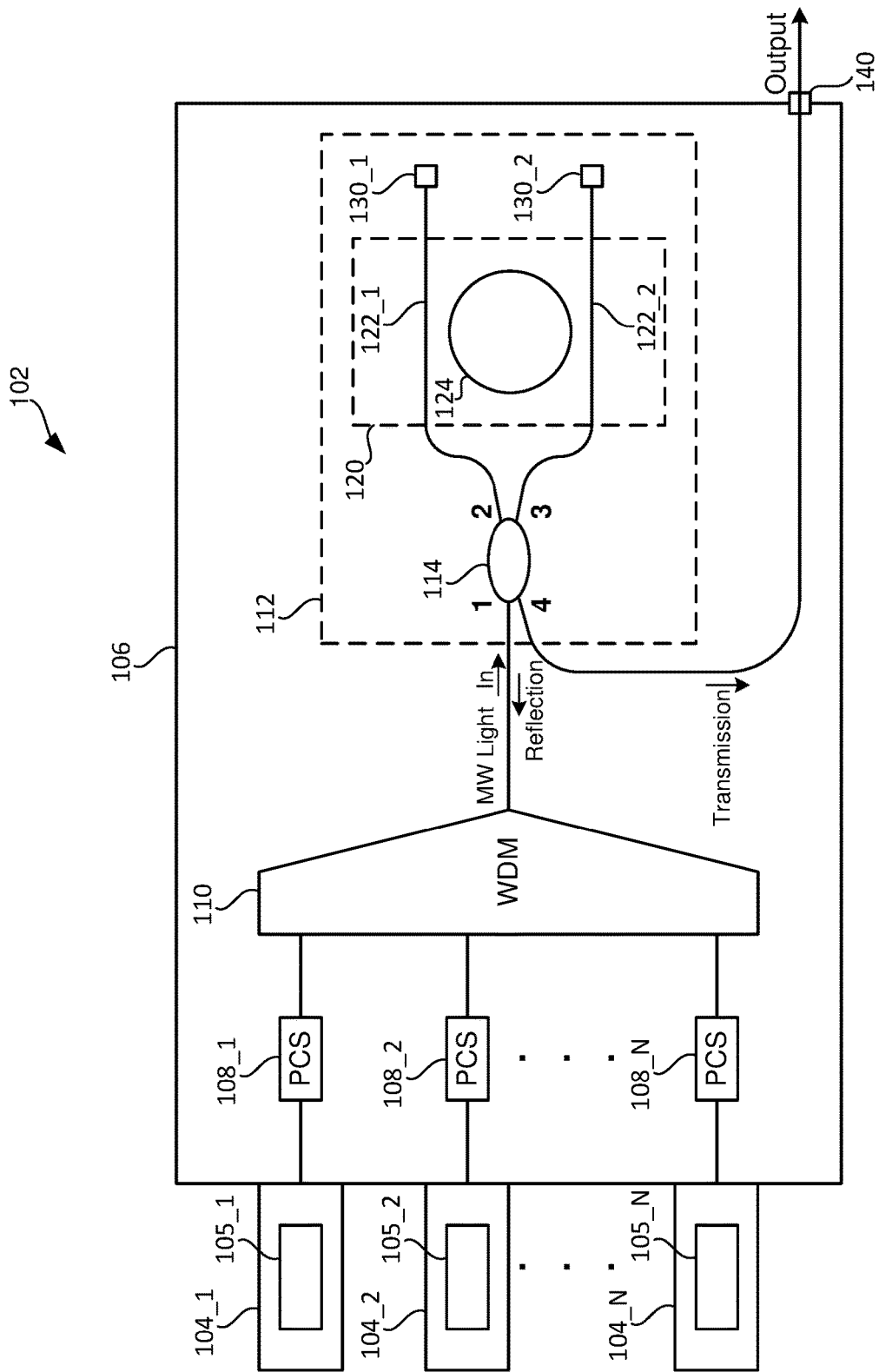
FIG. 1 illustrates a narrow linewidth multi-wavelength light source, according to an embodiment of the present technology.

Disclosed herein are light sources that produce narrow linewidth multi-wavelength (MW) light, and thus, can be referred to more specifically, as narrow linewidth MW light sources. The linewidth of a single wavelength light source, such as a laser, is the width of the optical spectrum of the output of the light source at its full width half-maximum (FWHM). Where a light source is a multi-wavelength (MW) light source that produces multiple different and spectrally spaced apart wavelengths of light, each of the different wavelengths of light has its own linewidth. The narrow linewidth MW light produced by the light sources disclosed herein beneficially have a high side mode suppression ratio (SMSR). In accordance with certain embodiments of the present technology, the narrow linewidth MW light that is output by a MW light source disclosed herein includes multiple different and spectrally spaced apart wavelengths of light, wherein each of the different and spectrally spaced apart wavelengths of light has a narrow emission linewidth that is no greater than 100 kHz, and is preferably on the order of tens of kHz. However, it is also possible that each of the different and spectrally spaced apart wavelengths of the light emitted by a narrow linewidth MW light source disclosed herein has a linewidth greater than 100 kHz, depending upon implementation and system requirements. The light sources disclosed herein can be used in coherent transmission systems and remote modulation systems, but are not limited thereto.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to the same or similar parts or elements throughout. In addition, the first digit of a reference number identifies the drawing in which the reference number first appears.

FIG. 1 illustrates a narrow linewidth MW light source 102, according to an embodiment of the present technology. The narrow linewidth MW light source 102 is shown as including a plurality of gain chips 104_1 though 104_N, and a wavelength combiner and reflector chip 106. The narrow linewidth MW light source 102 can also be referred to more succinctly herein as an MW light source 102, or even more succinctly as a light source 102.

The wavelength combiner and reflector chip 106 can be implemented as a silicon-on-insulator (SOI) chip, or as planar lightwave circuit (PLC) chip. Accordingly, where the wavelength combiner and reflector chip 106 is implemented as an SOI chip or a PLC chip, it can also be referred to herein as the SOI/PLC chip 106.

The optical gain chips 104_1 through 104_N can be referred to individually as an optical gain chip 104, or collectively as the optical gain chips 104. The optical gain chips 104 can also be referred to more succinctly as gain chips 104. Exemplary values for N are 40, 80 or 100, in which case the MW light source 102 would include 40, 80 or 100 gain chips and the MW light output from the MW light source 102 would include 40, 80 or 100 different wavelengths of light. There are just a few exemplary values for N, which are not intended to be limiting. Each of the gain chips 104 includes a respective internal laser cavity 105. More specifically, the gain chip 104_1 includes an internal laser cavity 105_1, the gain chip 104_2 includes an internal laser cavity 105_2, . . . , and the gain chip 104_N includes an internal laser cavity 105_N. Each of the internal laser cavities can be implemented as a Fabry-Pérot cavity, but is not limited thereto.

Still referring to FIG. 1, the wavelength combiner and reflector chip 106 is shown as including a plurality of phase control sections (PCSs) 108_1 though 108_N, a wavelength division multiplexer (WDM) 110, and a micro-ring resonator (MRR) based reflector 112, all based on an optical waveguide. The PCSs 108_1 though 108_N can be referred to individually as a PCS 108, or collectively as the PCSs 108. Each PCS 108 can be used to control or tune the phase of each reflected light (also referred to as feedback light) to match that of respective internal cavity light. For example, current may be applied to the PCS 108 (or a heater coupled to the PCS 108) so the phase of feedback light is matched with internal cavity light. The current applied to a respective PCS 108 may be chosen according to a look up table or controlled with an external control circuit. As can be appreciated from the below description, the gain chips 104 and the components the wavelength combiner and reflector chip 106 provide external cavity lasers.

In accordance with the embodiment of FIG. 1, each of the gain chips 104 is butt-coupled (also known as end-coupled) to the wavelength combiner and reflector chip 106. Each of gain chips 104 can include an III-V based material, such as, but not limited to, Iridium Phosphide (InP), which provides gain for lasing. In accordance with certain embodiments, each of the gain chips 104 can be implemented as a semiconductor optical amplifier (SOA) with one end facet that is high-reflection (HR) coated and the other end facet that is anti-reflection (AR) coated. The end facets of a gain chip are also known as end faces. The internal laser cavity 105 of a gain chip 104 can be formed by the pair of end facets.

Each of the gain chips 104 generates and outputs light, which can also be referred to as a light beam. After being launched into the wavelength combiner and reflector chip 106, the output light from each gain chip 104 is sent into a respective phase control section (PCS) 108 where the phase of feedback light (also referred to below as reflection light) is adjusted to finely tune the longitudinal mode. The light from each PCS 108 is sent to a different input port of the WDM 110, and is combined with other channels of light by the WDM 110 to produce multi-wavelength (MW) light, or more generally, a combined light beam. The combined light beam that is output by the WDM 110 is provided to the MRR based reflector 112. The MRR based reflector 112 receives the combined light beam from the WDM 110 and generates both a reflection MW light beam and a transmission MW light beam. The transmission MW light beam can be output from the light source 102 via an output port 140 of the light source 102. In other words, the transmission MW light beam generated by the MRR based reflector 112 can be the narrow linewidth MW light that is produced by the light source 102. Alternatively, the transmission MW light beam generated by the MRR based reflector 112 can be provided to an optical amplifier and/or one or more other optical components before being provided to the output port 140 of the light source 102. Accordingly, more generally, the transmission MW light beam generated by the MRR based reflector 112 can be the narrow linewidth MW light produced by the light source 102, or can be used to produce the narrow linewidth MW light produced by the light source 102.

Still referring to FIG. 1, the WDM 110 receives the reflection MW light beam from the MRR based reflector 112, separates the reflection MW light beam into a plurality of different wavelengths of light, and provides each of the different wavelengths of light via a respective one of the phase control sections 108 to a respective one of the gain chips 104 to thereby self seed the internal laser cavity 105 of the respective one of the gain chips 104.

Initially, the light beam generated by each gain chip 104 includes multiple wavelengths of light. However, each input port of WDM 110 only selects one pre-defined wavelength from a respective gain chip 104 while suppressing other wavelengths, and after this wavelength is reflected back to the gain chip 104 to self seed the internal light, the wavelength selected by the WDM 110 will be enhanced in intensity while other wavelengths in the internal cavity will be suppressed, leading to single wavelength operation for each of the gain chips 104. The MRR based reflector 112 helps achieve narrow linewidth of single mode laser light. The combination of different stabilized single mode laser lights forms the narrow linewidth MW light that is produced by the light source 102.

In the embodiment of FIG. 1, the MRR based reflector 112 is a loop type reflector, and thus may be referred to more specifically as an MRR based loop reflector 112, or more generally as a loop reflector 112. The MRR based loop reflector 112 in FIG. 1 includes a 2×2 optical coupler (OC) 114 and an add-drop MRR 120. The 2×2 OC 114 is shown as including four ports, labeled 1, 2, 3, and 4. In the embodiment of FIG. 1, the add-drop MRR 120 is shown as including a pair of optical waveguides 122_1 and 122_2, between which is located at optical ring 124. The optical ring 124 can also be referred to as an optical micro-ring, or as a micro-ring. In alternative embodiments, described below, e.g., with reference to FIGS. 3-5, the MRR based reflector 112 is implemented in various different manners.

The combined light that is output by the WDM 110 is sent into the 2×2 OC 114 and then to an add-drop MRR 120 of the MRR based loop type reflector 112. In accordance with certain embodiments, the add-drop MRR 120, which can be referred to more succinctly as the add-drop MRR 120, includes an optical ring 124 (also known as a micro-ring or an optical micro-ring) located between two waveguides 122_1 and 122_2, as noted above. In accordance with certain embodiments, the add-drop MRR 120 has a free spectral range (FSR) equal to the channel spacing of the WDM 110, or a subharmonic thereof. The channel spacing of the WDM 110 can be, for example, 100 GHz or 200 GHz, but is not limited thereto. Accordingly, where the channel spacing of the WDM 110 is 100 GHz, then the FSR of the add-drop MRR 120 can be equal to 100 GHz or a subharmonic thereof, such as, but not limited to, 50 GHz.

The combined light launched by the WDM 110 into the MRR based loop reflector 112 is first sent to the 2×2 OC 114 via port 1 thereof and is split into two combined light beams, which can also be referred to as two MW light beams. One of the two MW light beams is output through port 2 of the 2×2 OC 114, transmits in a clockwise direction, and is then provided to the waveguide 122_1. The other one of the two MW light beams is output through port 3 of the 2×2 OC 114, transmits in a counter clockwise direction, and is then provided to the waveguide 122_2. In the clockwise direction, MW light coupled into the add-drop MRR 120 via the optical waveguide 122_1 is used to generate a first drop portion of MW light that is dropped to the optical waveguide 122_2 and returned via port 3 to the 2×2 OC 114, and a first pass portion of MW light that passes through the add-drop MRR 120 and is sent to an absorber 130_1. Meanwhile, in the counter clockwise direction, MW light coupled into the add-drop MRR 120 via the optical waveguide 122_2 is used to generate a second drop portion of MW light that is dropped to the optical waveguide 122_1 and returned via port 2 to the 2×2 OC 114, and a second pass portion of MW light that passes through the add-drop MRR 120 and is sent to an absorber 130_2.

The absorbers 130_1 and 130_2, which can be referred to individually as an absorber 130, or can be referred to collectively as the absorbers 130, are introduced to absorb the first and second pass portions of MW light so that no undesired reflection is returned back to the gain chips 104. The absorbers 130 may be implemented in a variety of forms, including but not limited to: an optical attenuator, a monitoring photo-detector (mPD), or a mPD together with an attenuator, e.g., where the attenuator is placed between the MRR and mPD. The output of each mPD may be used to control a heater attached to the add-drop MRR 120 to tune the resonance wavelength to match that of the WDM passband. It should be noted that there can be different ways to dissipate the unwanted reflections other than the absorbers 130. For example, all the waveguides can be extended to the edge of the SOI/PLC chip, which by itself can be AR coated or angled.

After experiencing the same optical path and phase delay, the two returned MW light beams provided to port 3 and port 2 of the 2×2 OC 114 are coherently combined at the 2×2 OC 114, and generate two outputs: one of the outputs is sent back to the WDM 110 via port 1 and is the reflection MW light generated by the MRR based loop reflector 112; the other one of the outputs is sent out via port 4 and is the transmission MW light generated by the MRR based loop reflector 112. The reflected MW light is sent back to the WDM 110, which in the reverse direction, functions as a demultiplexer. The reflected MW light is separated by the WDM 110 into individual wavelength channels that are separated from one another by the channel spacing (e.g., 100 GHz or 200 GHz, but not limited thereto) of the WDM 110. The reflected light beams from the various channels (that have different wavelengths than one another) are sent back to respective gain chips 104 via its corresponding PCS 108 to form the external cavity and self-seed to the internal laser cavities 105 and facilitate single mode operation thereof. The transmitted light from the MRR based loop reflector 112 becomes the output of the MW light source 102, or is used to produce the output of the MW light source 102, as discussed above. In other words, in the embodiment of FIG. 1, port 4 of the 2×2 OC 114 can be directly optically coupled to the output port 140 of the light source 102. Alternatively, one or more optical components (not shown), such as an optical amplifier, can be within an optical path between port 4 of the 2×2 OC 114 and the output port 140 of the light source 102.

As noted above, in accordance with certain embodiments of the present technology, such as the embodiment shown in FIG. 1, each of the gain chips 104 is butt-coupled to the wavelength combiner and reflector chip 106. The butt-coupling can be used to integrate each gain chip 104 with or onto the wavelength combiner and reflector chip. However, in practice, the coupling process to provide butt-coupling requires very precise alignment, both vertical and horizontal, and angles, due to the small size of the laser beam (also referred to herein as the light beam). In addition, butt-coupling may suffer from undesired reflection at the coupling facet. In accordance with alternative embodiments of the present technology, to avoid these difficulties, instead of using butt-coupling, evanescent-coupling is used to integrate the gain chips 104 onto the wavelength combiner and reflector chip 106. For example, in the MW light source 202 of FIG. 2, each gain chip 104 with an extended evanescent-coupler is flip-chip mounted onto the wavelength combiner and reflector chip 106. In other words, the narrow linewidth MW light source 202 in FIG. 2, which can also be referred to more succinctly herein as a MW light source 202, has its gain chips 104 evanescent-coupled onto the wavelength combiner and reflector chip 106. Exemplary details of how one of the gain chips 104 can be evanescent-coupled to the wavelength combiner and reflector chip are described below with reference to FIG. 6. The only difference between the MW light source 202 of FIG. 2 and the MW light source 102 of FIG. 1 is the difference in the manner in which the gain chips 104 are coupled to the wavelength combiner and reflector chip. Accordingly, since the MW light source 202 operates in the same manner as the MW light source 102, operation of the MW light source 202 can be appreciated from the above discussion of FIG. 1, and thus this operation need not be repeated.

In an evanescent-coupling, each gain chip 104 may be coupled to the wavelength combiner and reflector chip via direct contact, where transverse-transfer occurs between the laser active area of each gain chip 104 and the wavelength combiner and reflector chip 106. Evanescent-coupling may be also realized via non-direct contact between a laser waveguide of a gain chip 104 and the wavelength combiner and reflector chip 106. Each of the gain chips 104 may be fabricated to include a planar laser waveguide (e.g., 610 in FIG. 6) and an end-coupled planar lightwave circuit (PLC) waveguide (e.g., 630 in FIG. 6), which may be based on silicon nitride. The end faces (also known as end facets) of the planar laser waveguide together with the planar laser waveguide itself form the laser resonator. The light from the planar laser waveguide is first end-coupled to the PLC waveguide, and is then coupled to the wavelength combiner and reflector chip via evanescent-coupling between the PLC waveguide and the SOI/PLC waveguide. As noted above, additional exemplary details of how one of the gain chips 104 can be evanescent-coupled to the wavelength combiner and reflector chip are described below with reference to FIG. 6.

Figure 2:
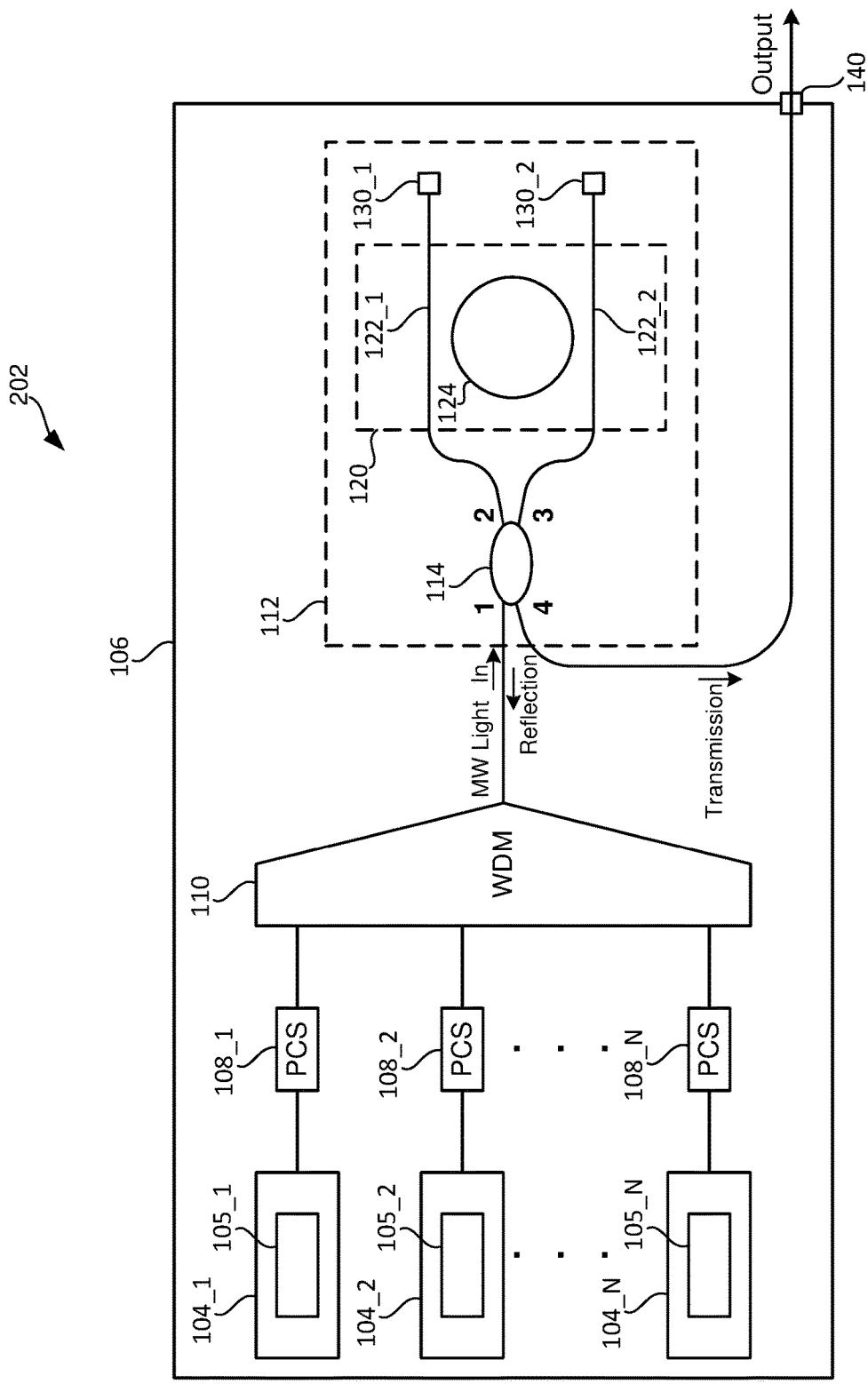
FIG. 2 illustrates a narrow linewidth multi-wavelength light source, according to another embodiment of the present technology.

In the MW light sources 102 and 202, described above with reference to FIGS. 1 and 2, a 2×2 OC 114 and an add-drop MRR 120 were used to form the MRR based loop reflector 112, with one of the ports of the 2×2 OC 114 (labeled port 4) used to provide the output of the MW light source (102 or 202). In the embodiments of FIGS. 1 and 2, the MRR based reflector 112 is implemented using a single 2×2 OC 114 and the add-drop MRR 120, wherein the add-drop MRR 120 includes an optical ring 124 located between a pair of waveguides 122_1 and 122_2 that are respectively coupled to ports 2 and 3 of the single 2×2 OC 114. In accordance with alternative embodiments, described below with reference to FIGS. 3, 4 and 5, the MRR based loop reflector 112 is implemented in various different manners.

Figure 3:
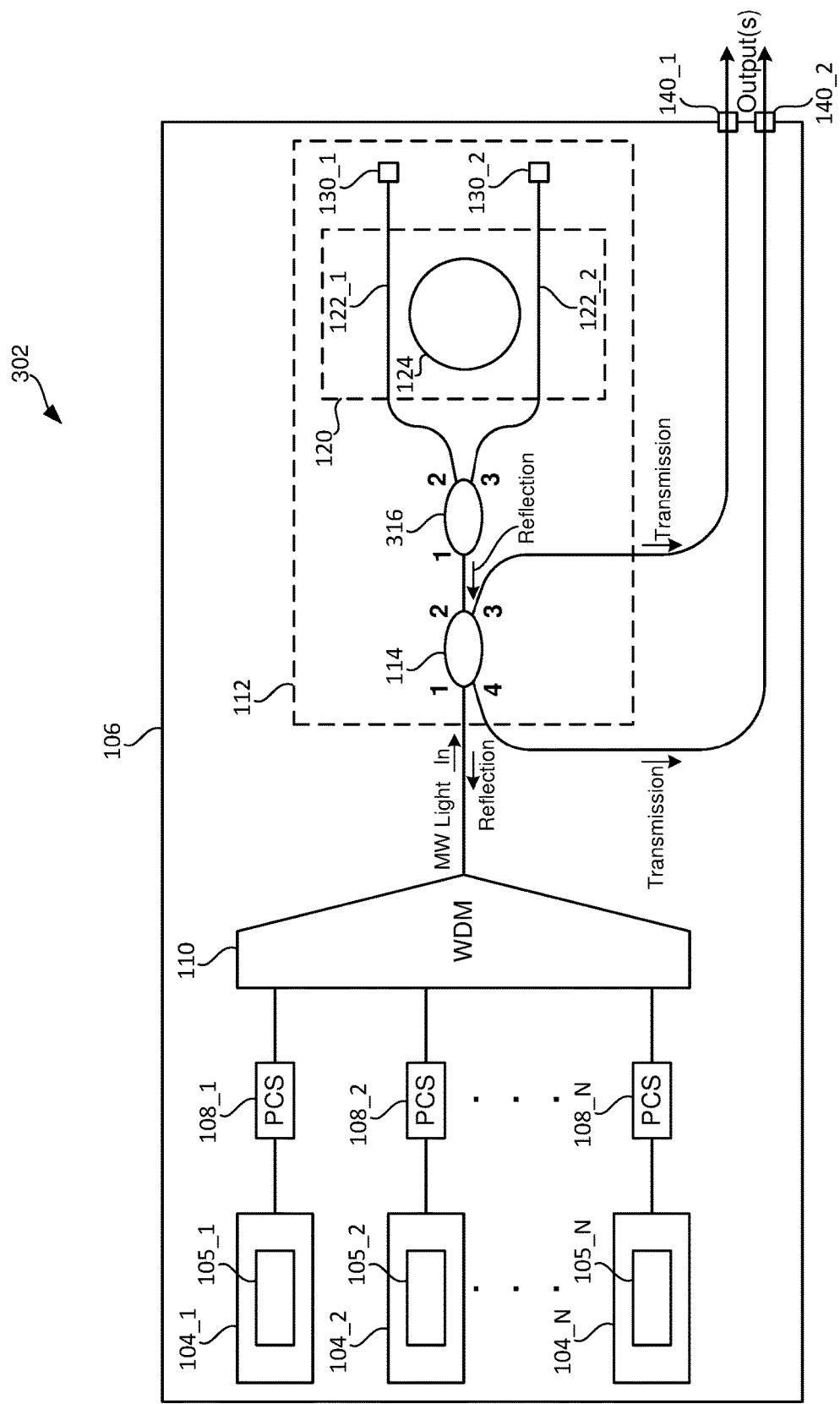
FIG. 3 illustrates a narrow linewidth multi-wavelength light source, according to still another embodiment of the present technology.

Referring to FIG. 3, a narrow linewidth MW light source 302 shown therein is similar to the narrow linewidth MW light source 202 shown in FIG. 2, except the MRR based loop reflector 112 also includes a 1×2 optical coupler (OC) 316 added optically downstream of the 2×2 OC 114. The 1×2 OC 316 (which is also known as a Y-junction) is shown as including three ports, labeled 1, 2, and 3. In accordance with an embodiment, the 1×2 OC 316 (or Y-junction) has a 50/50 power splitting ratio, so the loop reflector 112 including the OC 316 and the add-drop MRR 120 is a full reflector.

In the embodiment of FIG. 3, the combined light (which can also be referred to as MW light) launched by the WDM 110 into the MRR based loop reflector 112 is first sent to the 2×2 OC 114 via port 1 thereof and is split into two combined light beams (which can also be referred to as two MW light beams). One of the two MW light beams is output through port 2 of the 2×2 OC 114 and provided to port 1 of the 1×2 OC 316. The other one of the two MW light beams is output through port 3 of the 2×2 OC 114, and as explained below, can be the MW light (or used to produce the MW light) that is output by the MW light source 302.

The one of the two MW light beams, which is output through port 2 of the 2×2 OC 114 and provided to port 1 of the 1×2 OC 316, is split into two further MW light beams, one of which is output through port 2 of the 1×2 OC 316, and the other one of which is output through port 3 of the 1×2 OC 316.

The one of the two MW light beams that is output through port 2 of the 1×2 OC 316, transmits in a clockwise direction, and is then provided to the waveguide 122_1. The other one of the two MW light beams is output through port 3 of the 1×2 OC 316, transmits in a counter clockwise direction, and is then provided to the waveguide 122_2. In the clockwise direction, MW light coupled into the add-drop MRR 120 via the optical waveguide 122_1 is used to generate a first drop portion of MW light that is dropped to the optical waveguide 122_2 and returned to the 1×2 OC 316 via port 3, and a first pass portion of MW light that passes through the add-drop MRR 120 and is sent to an absorber 130_1. Meanwhile, in the counter clockwise direction, MW light coupled into the add-drop MRR 120 via the optical waveguide 122_2 is used to generate a second drop portion of MW light that is dropped to the optical waveguide 122_1 and returned to the 1×2 OC 316 via port 2, and a second pass portion of MW light that passes through the add-drop MRR 120 and is sent to an absorber 130_2.

The two returned MW light beams received at ports 2 and 3 of the 1×2 OC 316 are combined by the 1×2 OC 316. The combined returned MW light beam, which is output from port 1 of the 1×2 OC 316, passes back into the 2×2 OC 114 via port 2 of the 2×2 OC 114. This returned MW light beam is split into two outputs, one of which is sent back to the WDM 110 via port 1 of the OC 114 and is the reflection MW light generated by the MRR based loop reflector 112, and the other of which is output via port 4 of the 2×2 OC 114 and is the transmission MW light generated by the MRR based loop reflector 112.

The output of the MW light source 302 can be provided by the 2×2 OC 114 in a variety of different manners. The ports 4 and 3 of the 2×2 OC 114 may be used as (or optically coupled to) output ports 140_1 and 140_2, providing two outputs. Each time a light beam passes through an optical coupler it may experience some insertion loss. Since the light from port 4 of the 2×2 OC 114 has double passed the 2×2 OC 114 and experiences possible insertion loss of the add-drop MRR 120, the output power from port 4 of the 2×2 OC 114 is lower than that from port 3 of the 2×2 OC 114. The outputs from ports 4 and 3 of the 2×2 OC 114 can be combined by another optical coupler (e.g., a further 1×2 OC or Y-junction, not shown in FIG. 3) to provide a single output, where a phase control section (similar to the PCS 103 discussed above) is preferably used to adjust the phase delay between the two outputs to maximize the final single output power. Since the two outputs exhibit different power levels, the final combined output may lose some power at the combiner. Alternatively, port 4 of the 2×2 OC 114 may instead be terminated or absorbed, in which case only port 3 of the 2×2 OC 114 is used to provide the MW light output.

Referring back to the embodiments of FIGS. 1, 2 and 3, the ports of the MRR based reflectors 112 at which the absorbers 130 are located can be referred to as MRR pass ports. In the embodiments of FIGS. 1, 2 and 3, portions of the MW light beams that reach the MRR pass ports are absorbed or terminated, and thus, are not used to produce the MW light outputs of the MW light sources 102, 202 and 302. In alternative embodiments, one of which is described below with reference to FIG. 4, the portion of the MS light beams provided to the MRR pass ports are used to produce an output of an MW light source 402.

Figure 4:
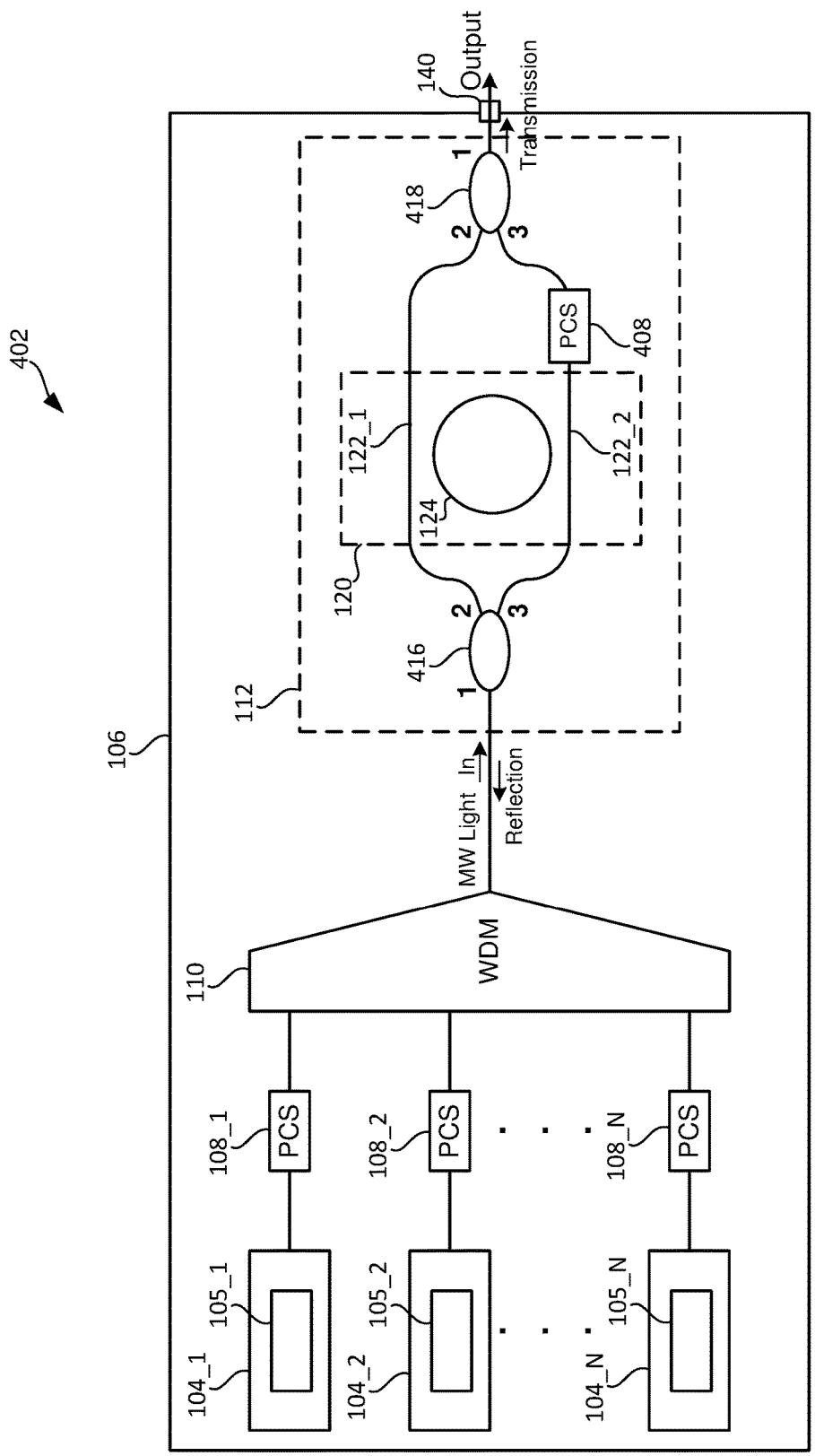
FIG. 4 illustrates a narrow linewidth multi-wavelength light source, according to a further embodiment of the present technology.

Referring to FIG. 4, an MW light source 402 is shown therein, wherein the MRR based reflector 112 is shown as including a first 1×2 OC 416, an add-drop MRR 120, and a second 1×2 OC 418. The add-drop MRR 120 is shown as including a pair of optical waveguides 122_1 and 122_2, between which is located at optical ring 124. However, unlike the embodiments described above with reference to FIGS. 1, 2, and 3, the portion of the MS light beams provided to the MRR pass parts are not terminated by absorbers or the like. Rather, they are provided to ports 2 and 3 of the second 1×2 OC 418, wherein they are combined and output at port 1 of the second 1×2 OC 418. According, in the embodiment of FIG. 4, the output port 140 of the MW light source 402 can be coupled to port 1 of the 1×2 OC 418.

More specifically, in the embodiment of FIG. 4, the combined light (also referred to as the MW light) output from the WDM 112 is provided to port 1 of the 1×2 OC 416, and it split into two combined light beams (also referred to as two MW light beams), one of which is output via port 2 of the 1×2 OC 416, and the other one of which is output via port 3 of the 1×2 OC 416. The one of the two MW light beams, which is output through port 2 of the 1×2 OC 416, transmits in a clockwise direction, and is then provide to the waveguide 122_1. The other one of the two MW light beams, which is output through port 3 of the 1×2 OC 416, transmits in a counter clockwise direction, and is then provided to the waveguide 122_2. In the clockwise direction, MW light coupled into the add-drop MRR 120 via the optical waveguide 122_1 is used to generate a first drop portion of MW light that is dropped to the optical waveguide 122_2 and returned to the 1×2 OC 416 via port 3, and a first pass portion of MW light is provided to port 2 of the 1×2 OC 418. Meanwhile, in the counter clockwise direction, MW light coupled into the add-drop MRR 120 via the optical waveguide 122_2 is used to generate a second drop portion of MW light that is dropped to the optical waveguide 122_1 and returned to the 1×2 OC 416 via port 2, and a second pass portion of MW light that passes through the add-drop MRR 120 is provided to port 3 of the 1×2 OC 418. The portions of the MW light that are returned to the 1×2 OC 416, via ports 2 and 3 thereof, are combined by the 1×2 OC 416 and forms the reflection light of the MRR based loop reflector 112. As was the case in the other embodiments described above, the reflected MW light is sent back to the WDM 110 and is separated by the WDM 110 into individual frequency channels that are separated from one another by the channel spacing (e.g., 100 GHz or 200 GHz, but not limited thereto) of the WDM 110. The reflected light beams from the various channels (that have different wavelengths than one another) are sent back to respective gain chips 104 via its corresponding PCS 108 to form the external cavity and self-seed to the internal cavity light, and facilitate single mode operation.

The two pass portions of the MW light, which are provided to ports 2 and 3 of the 1×2 OC 418, are combined at the 1×2 OC 418, which may have 50/50 coupling ratio, to form a single output of the generated narrow linewidth MW light source. In accordance with an embodiment, a phase control section (PCS) 408 is included in one of the paths between the add-drop MRR 120 and the 1×2 OC 418 to cause the combined light to constructively interfere with one another and thereby maximize the signal output power. The port 1 of the 1×2 OC 418 can be coupled directly to the output port 140 of the light source 402, in which case the transmission MW light beam produced by the MRR based reflector 112 is provided directed to an output port 140 of the light source 402. Alternatively, one or more optical components (e.g., an optical amplifier) can be within an optical path between the port 1 of the 1×2 OC 418 and the output port 140, in which case the transmission MW light beam produced by the MRR based reflector 112 can first be optically amplified and/or optically processed in some other manner before being provided to the output port 140 of the light source 402.

In the embodiment of FIG. 4, the coupling ratios between the micro-ring 124 and the waveguides 122_1 and 122_2 may deviate from what is designed, so the accuracy of reflection/pass ratio of the add-drop MRR 120 may depend on the fabrication tolerance, which may make the output power level relatively difficult to define and control. Small pass portions result in low and relatively more difficultly defined output power. Large pass portions would lead to low Q value of the MRR and less reflected (feedback) light power.

In the embodiments described above with reference to FIGS. 1-4, MW light single passes the add-drop MRR 120 to form the reflected (feedback) light. In accordance with another embodiment, described below with reference to FIG. 5, MW light inside the MRR based reflector 112 may double pass the add-drop MRR 120. Double pass is expected to increase the sharpness of filter shape, but also may double insertion loss of the add-drop MRR 120.

Figure 5:
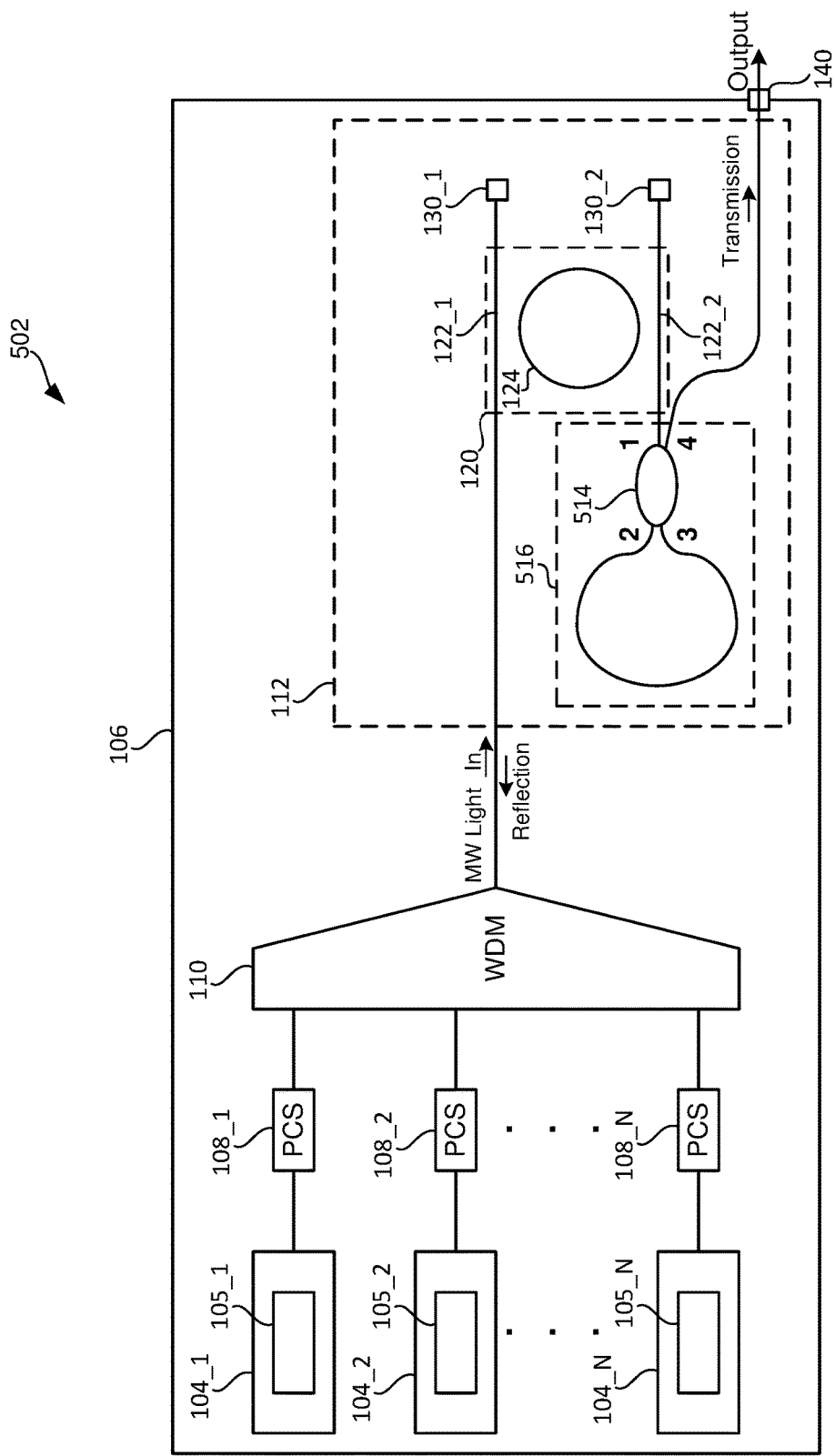
FIG. 5 illustrates a narrow linewidth multi-wavelength light source, according to still a further embodiment of the present technology.

Referring to the MW light source 502 in FIG. 5, the MRR based reflector 112 is shown as including an add-drop MRR 120 followed by a loop mirror 516 based on a 2×2 OC 514. The combined light (also referred to as the MW light) launched by the WDM 110 into the MRR based reflector 112 is first sent to the waveguide 122_1 and is used to generate a first drop portion of MW light that is dropped to the optical waveguide 122_2 and a first pass portion of MW light that passes through the add-drop MRR 120 and is sent to an absorber 130_1. The first drop portion of MW light is input into the loop mirror 516 via port 1 of the 2×2 OC 514. A portion of the MW light that it output from the loop mirror 516, via port 4 of the 2×2 OC 514, can be (or can be used to produce) the narrow linewidth MW light output by the light source 502. Another portion of the MW light that is output from the loop mirror 516, via port 1 of the 2×2 OC 514, returns to the waveguide 122_2, is added back to the micro-ring 124, dropped to the waveguide 122_1, and returns to the WDM 110, while the pass portion is sent to the absorber 130_2. The reflected MW light is separated by the WDM 110 into individual wavelength channels that are separated from one another by the channel spacing (e.g., 100 GHz or 200 GHz, but not limited thereto) of the WDM 110. The reflected light beams from the various channels (that have different wavelengths than one another) are sent back to respective gain chips 104 via its corresponding PCS 108 to form the external cavity and self-seed to the internal laser cavities 105 and facilitate single mode operation thereof.

In the embodiments of FIGS. 1-3 and 5, the absorbers 130 are used to absorb the MW pass portion light so that no undesired reflection is returned back to the gain chips 104. As noted above, the absorbers 130 may be implemented in a variety of forms, including but not limited to: an optical attenuator, a monitoring photo-detector (mPD), or a mPD together with an attenuator, e.g., where the attenuator is placed between the MRR and mPD. The output of each mPD may be used to control a heater attached to the add-drop MRR 120 to tune the resonance wavelength to match that of the WDM passband. It should be noted that there can be different ways to dissipate the unwanted reflections other than the absorbers 130. For example, all the waveguides can be extended to the edge of the SOI/PLC chip, which by itself can be AR coated or angled.

In accordance with certain embodiments of the present technology, the WDM 110 may be implemented as an arrayed waveguide grating (AWG), which can separate and combine signals with different wavelengths. Such an AWG type WDM can be built as a planar lightwave circuit, where the light coming from an input first enters a multimode waveguide section, then propagates through several single-mode waveguides to a second multimode section, and finally into the outputs. Wavelength filtering can be based on an interference effect and the different optical path lengths in the single-mode waveguides. Any frequency component of the input propagates through all single-mode waveguides, and the output in any channel results from the superposition (interference) of all these contributions. Wavelength-dependent phase shifts lead to a wavelength-dependent overall throughput for any combination of an input port and an output port. Instead of implementing the WDM 110 as an AWG, the WDM 110 can alternatively be implemented in other manners. For example, in other embodiments the WDM 110 can be a ring-resonator based WDM or an interferometer based WDM, but is not limited thereto.

Various different implementations of the MRR based reflector 112 were described above with reference to FIGS. 1-5. One of ordinary skills in the art reading this disclosure would be appreciated that the MRR based reflector 112 can be implemented in still other manners, while still being within the scope of the embodiments of the present technology. In the embodiments shown in and described with reference to FIGS. 2-5, evanescent coupling is used to integrate gain chips 104 to the wavelength combiner and reflector chip 106. Alternatively, the gain chips 104 in the embodiments of FIGS. 2-5 can be butt-coupled to the wavelength combiner and reflector chip 106. The wavelength combiner and reflector chip 106 of any one of the above described embodiments can be an SOI chip, or a PLC chip, but is not limited thereto.

Materials from which an SOI chip or a PLC chip (such as silicon nitride) are made are dispersive materials, with dispersion determined by both the material itself as well as the waveguide geometry. Chromatic dispersion induces a group index variation along with wavelength, leading to wavelength dependent FSR of the add-drop MRR 120. A typically designed SOI MRR waveguide with a height around 200 nm and a width around 450 nm exhibits a negative dispersion with a value around two orders higher than that of silica fiber. This induces around 0.5 percent group index variation along the C band wavelength range and makes the edge resonance wavelength offset away from ITU grid up to +/−10 GHz. SOI waveguide height may be determined by a foundry, however in principle, the waveguide width and height may be optimally designed to engineer the dispersion value and minimize the ITU grid offset. For a silicon nitride waveguide, the dispersion can be engineered to be very small, with an ITU offset of about 0.1 GHz for the worst edge wavelength of C band. This actually induces negligible impact on the wavelength accuracy of the generated WDM light source.

In summary, embodiments of the present technology provide narrow linewidth MW light sources. Such MW light sources include a plurality of gain chips 104, each of which is either butt or evanescent coupled to a wavelength combiner and reflector chip 106. The wavelength combiner and reflector chip 106 includes a plurality of phase control sections 108, a WDM 110, and a MRR based reflector 112. Each gain chip 104 is coupled via a PCS 108 to a corresponding input port of the WDM 110. The combination or output port of the WDM 110 is coupled to the MRR based reflector 112, which provides feedback MW light back to self-seed each internal laser cavities 105 of the gain chips 104 after de-multiplexing, as well as the generated MW light that is the output (or is used to produce the output) of the MW light source. The MRR based reflector 112 may be implemented using a variety of configurations, including those described above with reference to FIG. 1-5.

Figure 6:
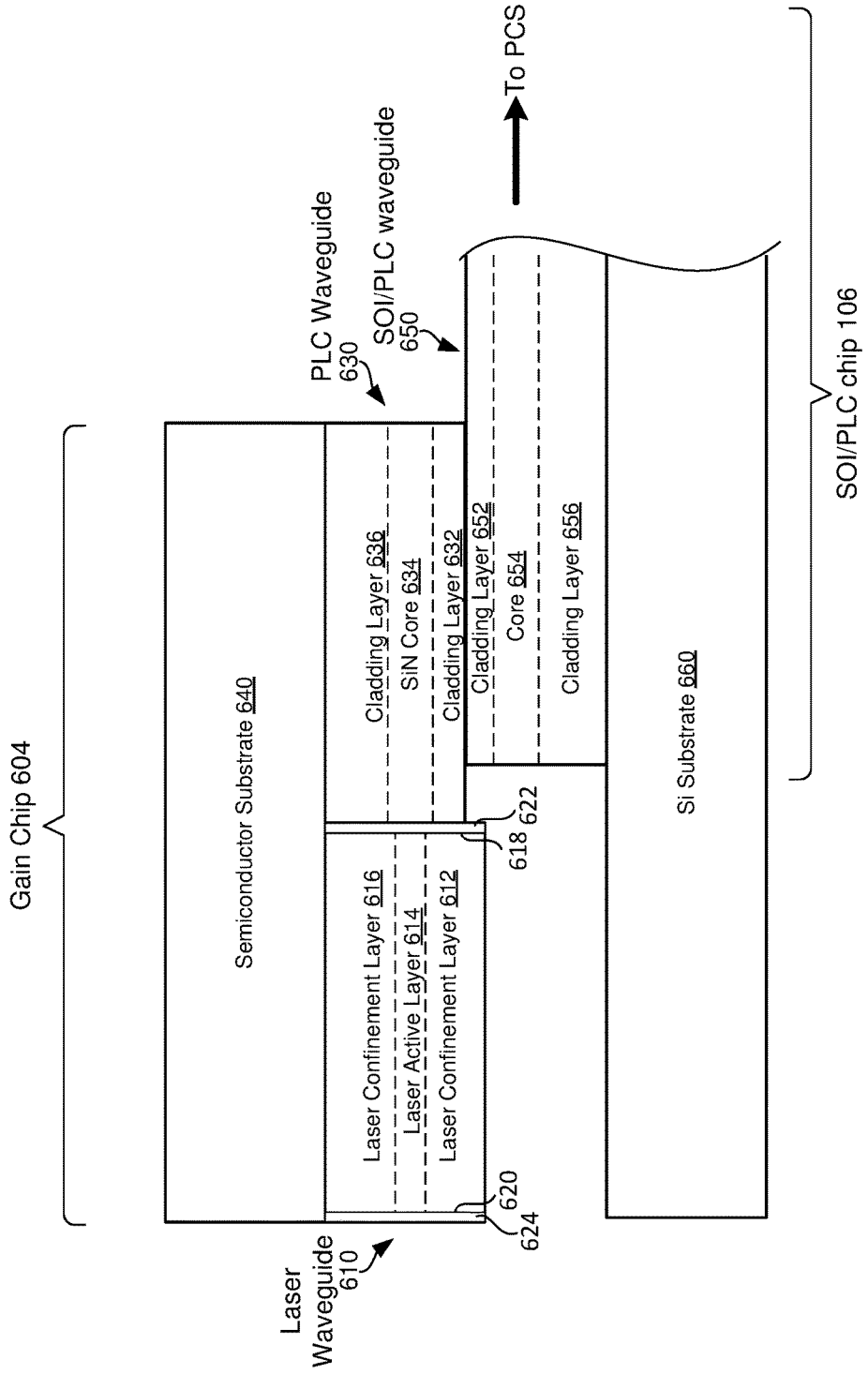
FIG. 6 illustrates exemplary details a gain chip that can be used in the narrow linewidth multi-wavelength light source of the various embodiments of the present technology, and explains how the gain chip can be evanescent-coupled to a silicon-on-insulator (SOI) or planar lightwave circuit (PLC) chip.

FIG. 6 will now be used to describe how an exemplary gain chip 604, which can be used as the gain chips 104 in the narrow linewidth MW light sources (e.g., 202, 302, 402 and 502) described above, can be coupled to a wavelength combiner and reflector chip 106 (implemented as a SOI/PLC chip 106) via an evanescent coupling.

Referring to FIG. 6, the gain chip 604 is shown as including a planar laser waveguide 610 that is end-coupled to a planar lightwave circuit (PLC) waveguide 630, which are both on a semiconductor substrate 640. The gain chip 604 can include a semiconductor optical amplifier (SOA) in place of the planar laser waveguide 610. In FIG. 6, the wavelength combiner and reflector chip 106 is presumed to be a SOI chip or a PLC chip, and thus, is referred to as an SOI/PLC chip 106. The SOI/PLC chip 106, to which the gain chip 604 is coupled, includes a waveguide 650, which is connected to another component of the SOI/PLC chip 106, such as a PCS 108 (not shown in FIG. 6, but shown in FIGS. 1-5). A silicon (Si) substrate 660 is shown as providing a support structure for the SOI/PLC chip 106. The waveguide 650, since it is part of the SOI/PLC chip 106, can also be referred to as the SOI/PLC waveguide 650.

The laser waveguide (or SOA) 610 includes laser confinement layers 612 and 616 that surround a laser active layer 614. The laser active layer 614 may be or include a III-V semiconductor multiple quantum wells. The laser confinement layers 612 and 616 may provide both optical confinement of gain chip optical modes as well as charge carrier confinement for localizing optical gain within the laser waveguide 610. After spatially selective material processing to form the laser waveguide 610 with end faces 618 and 620, one or more optical coating(s) can be applied on the end faces 618 and 620. For example, the end face 618 can be coated with an anti-reflective (AR) coating 622, and the end face 620 can be coated with a highly reflective (HR) coating 624. The end-couple PLC waveguide 630 can then be formed.

The end-couple PLC waveguide 630 includes a silicon nitride (SiN) core 634 surrounded by silica-based cladding layers 632 and 636. The thickness of cladding layer 636 may be chosen so as to substantially align the core 634 with the active laser layer 614. Vertical and lateral dimensions of the core 634 near the proximal end of waveguide 630 (i.e., near the end that is adjacent to the PLC waveguide 630) can be chosen to achieve the required degree of spatial mode matching.

As noted above, the end face 618 of the laser waveguide 610 can be coated with the AR coating 622, and the other end face 620 can be coated with the HR coating 624, prior to fabrication of the end-coupled PLC waveguide 630. The end faces 618 and 620, and the planar laser waveguide (or SOA) 610, form a laser resonator. The light generated from the laser waveguide (or SOA) 610 is first end-coupled into the PLC waveguide 630, and then evanescent coupled to the SOI/PLC waveguide 650. The SOI/PLC waveguide 650 includes a core 654 that is surrounded by cladding layers 652 and 656, and is connected to another component (e.g., a PCS 108) of the SOI/PLC chip 106.

The gain chip 604 in FIG. 6 is flip-chip mounted onto the SOI/PLC chip 106. In other words, a narrow linewidth MW light source 202 in FIG. 2, which can also be referred to more succinctly herein as a MW light source 202, has its gain chips 104 evanescent coupled onto the SOI/PLC chip 106. More specifically, referring to FIG. 6, there is an evanescent-coupling (also referred as side-coupling, transverse-transfer or directional coupling) between the PLC waveguide 630 and the SOI/PLC waveguide 650.

Figure 7:
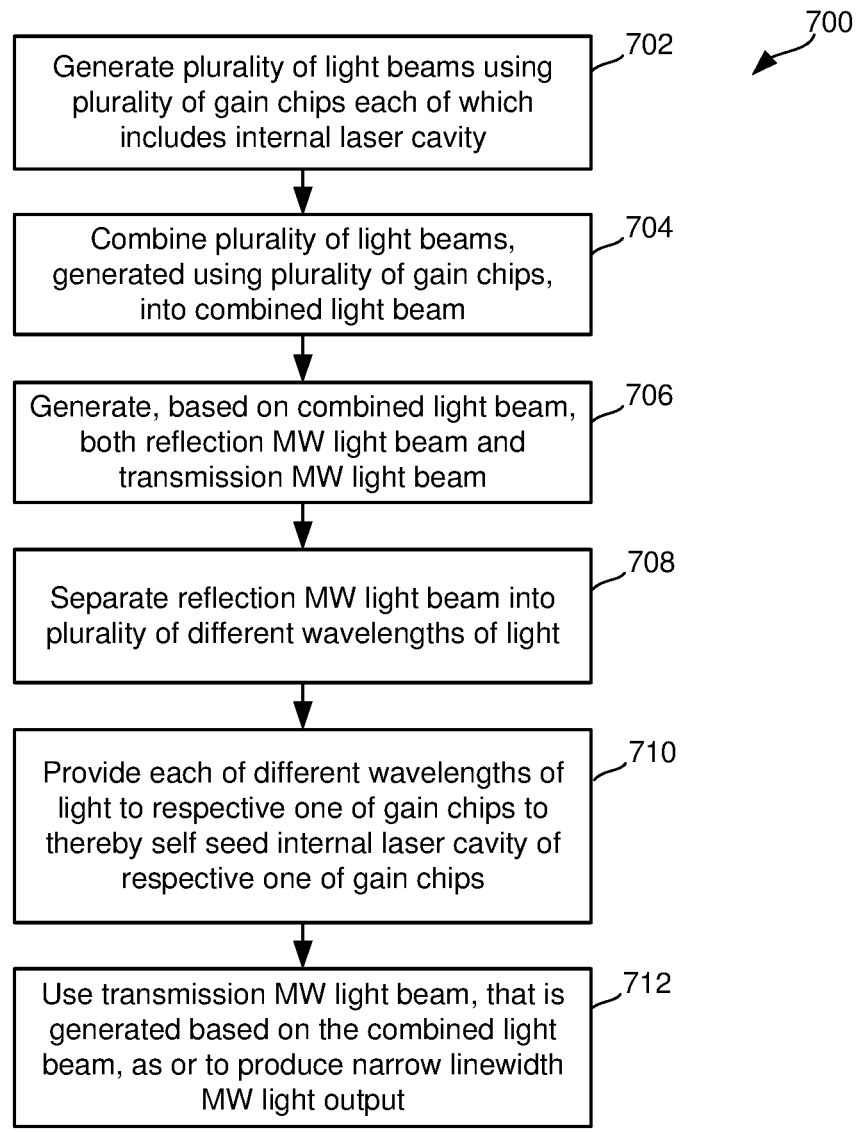
FIG. 7 is a high level flow diagram used to summarize various methods for producing narrow linewidth multi-wavelength light, in accordance with various embodiments of the present technology.

The high level flow diagram of FIG. 7 will now be used to summarize various methods for producing narrow linewidth multi-wavelength (MW) light, in accordance with embodiments of the present technology.

Referring to FIG. 7, step 702 involves generating a plurality of light beams using a plurality of gain chips each of which includes an internal laser cavity. Step 702 can be performed, e.g., by the gain chips 104, each of which includes an internal laser cavity 105.

Still referring to FIG. 7, step 704 involves combining the plurality of light beams, generated using the plurality of gain chips, into a combined light beam. The combined light beam, as noted above, can also be referred to as an MW light beam. As can be appreciated from the above discussion of FIGS. 1-5, step 704 can be implemented by a WDM (e.g., 110). In certain embodiments, the WDM is an AWG.

Step 706 involves generating, based on the combined light beam, both a reflection MW light beam and a transmission MW light beam. As can be appreciated from the above discussion of FIGS. 1-5, step 706 can be implemented by an MRR based loop reflector (e.g., 112), various different implementations of which were described above. More specifically, the generating both the reflection MW light beam and the transmission MW light beam can be performed using a MRR based reflector that includes one or more optical couplers (e.g., 114, 316, 416, 418, 514) and an add-drop MRR (e.g., 120), wherein the add-drop MRR has a free spectral range (FSR) equal to a channel spacing of the WDM (used to perform steps 706 and 708) or equal to a subharmonic of the channel spacing of the WDM.

Step 708 involves separating the reflection MW light beam into a plurality of different wavelengths of light. As can be appreciated from the above discussion of FIGS. 1-5, step 708 can be implemented by the same WDM (e.g., 110) that is used to implement step 704.

Step 710 involves providing each of the different wavelengths of light to a respective one of the gain chips to thereby self seed the internal laser cavity of the respective one of the gain chips. As can be appreciated from the above discussion of FIGS. 1-5, step 710 can be implemented by the same WDM (e.g., 110) that is used to implement steps 704 and 708, as well as by phase control sections (e.g., 108).

Further, as indicated at step 712, the transmission MW light beam, that is generated based on the combined light beam, can be used as or used to produce (e.g., can be amplified to produce) the narrow linewidth MW light. For example, as can be appreciated from the above discussion of FIGS. 1-5, the transmission MW light beam can be provided directed to an output port (e.g., 140) of a narrow linewidth MW light source (e.g., 102, 202, 302, 402, or 502), or can first be optically amplified and/or optically processed in some other manner before being provided to an output port of a light source.

A method can also include (e.g., between steps 708 and 710) controlling a phase of each the different wavelengths of light before they are provided to a respective one of the gain chips to thereby self seed the internal laser cavity of the respective one of the gain chips.

In accordance with certain embodiments of the present technology, steps 704, 706, 708 and 710 are implemented or performed by components of a common chip (e.g., 106) to which the gain chips (e.g., 104) used at step 702 are coupled.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate, preclude or suggest that a combination of these measures cannot be used to advantage. A computer program may be stored or distributed on a suitable medium, such as an optical storage medium or a solid-state medium supplied together with, or as part of, other hardware, but may also be distributed in other forms, such as via the Internet or other wired or wireless telecommunication systems.

What is claimed is:

1. A light source that produces narrow linewidth multi-wavelength (MW) light, the light source comprising:
a plurality of gain chips, each of which is configured to generate a light beam and each of which includes a laser cavity; and
a wavelength combiner and reflection chip coupled to the plurality of gain chips and including:
a plurality of phase control sections, each of which is coupled to a respective one of the gain chips;
a wavelength division multiplexer (WDM) configured to combine the light beams received from the gain chips, via the phase control sections, into a combined light beam; and
a micro-ring resonator (MRR) based reflector configured to receive the combined light beam from the WDM and generate both a reflection MW light beam and a transmission MW light beam;
wherein the WDM is configured to receive the reflection MW light beam from the MRR based reflector, separate the reflection MW light beam into a plurality of different wavelengths of light, and provide each of the different wavelengths of light via a respective one of the phase control sections to a respective one of the gain chips; and
wherein the transmission MW light beam generated by the MRR based reflector is the narrow linewidth MW light produced by the light source, or is used to produce the narrow linewidth MW light produced by the light source.

2. The light source of claim 1, wherein:
the wavelength combiner and reflector chip comprises a silicon-on-insulator (SOI) or planar lightwave circuit (PLC) chip; and
each of the gain chips is either butt-coupled or evanescent-coupled to the SOI or PLC chip.

3. The light source of claim 1, wherein the MRR based reflector includes:
an optical coupler configured to split the combined light beam into a first combined light beam and a second combined light beam; and
an add-drop MRR including first and second optical waveguides and an optical micro-ring positioned between the first and second optical waveguides.

4. The light source of claim 3, wherein the add-drop MRR has a free spectral range (FSR) equal to a channel spacing of the WDM or equal to a subharmonic of the channel spacing of the WDM.

5. The light source of claim 3, wherein:
the optical coupler of the MRR based reflector comprises a 2×2 optical coupler including first, second, third, and fourth ports;
the first port of the 2×2 optical coupler is coupled to the WDM;
the second port of the 2×2 optical coupler is coupled to the first optical waveguide of the add-drop MRR;
the third port of the 2×2 optical coupler is coupled to the second optical waveguide of the add-drop MRR; and
the fourth port of the 2×2 optical coupler outputs the transmission MW light beam generated by the MRR based reflector.

6. The light source of claim 3, wherein:
the first combined light beam is coupled into the add-drop MRR via the first optical waveguide, and the second combined light beam is coupled into the add-drop MRR via the second optical waveguide;
the add-drop MRR generates, based on the first combined light beam, a first drop portion of MW light that is dropped to the second optical waveguide, and a first pass portion of MW light that passes through the add-drop MRR;
the add-drop MRR generates, based on the second combined light beam, a second drop portion of MW light that is dropped to the first optical waveguide, and a second pass portion of MW light that passes through the add-drop MRR; and
the first and second drop portions of the MW light are returned to the optical coupler and are combined to generate the reflection MW light beam and the transmission MW light beam.

7. The light source of claim 6, further comprising an absorber or dissipater configured to absorb or dissipate the first and second pass portions of MW light that pass through the add-drop MRR.

8. The light source of claim 3, wherein:
the first combined light beam is coupled into the add-drop MRR via the first optical waveguide, and the second combined light beam is coupled into the add-drop MRR via the second optical waveguide;
the add-drop MRR generates, based on the first combined light beam, a first drop portion of MW light that is dropped to the second optical waveguide, and a first pass portion of MW light that passes through the add-drop MRR;
the add-drop MRR generates, based on the second combined light beam, a second drop portion of MW light that is dropped to the first optical waveguide, and a second pass portion of MW light that passes through the add-drop MRR;
the first and second drop portions of MW light are returned to the optical coupler and are combined to generate the reflection MW light beam; and
the MRR based reflector also includes a further optical coupler configured to generate the transmission MW light.

9. The light source of claim 8, wherein:
the optical coupler of the MRR based reflector comprises a first 1×2 optical coupler including first, second, and third ports;
a further optical coupler of the MRR based reflector comprises a second 1×2 optical coupler including first, second, and third ports;
the first port of the first 1×2 optical coupler of the MRR based reflector is coupled to the WDM;
the second port of the first 1×2 optical coupler of the MRR based reflector is coupled to the first optical waveguide of the add-drop MRR;
the third port of the first 1×2 optical coupler of the MRR based reflector is coupled to the second optical waveguide of the add-drop MRR;
the first port of the second 1×2 optical coupler of the MRR based reflector outputs the transmission MW light beam generated by the MRR based reflector;
the second port of the second 1×2 optical coupler of the MRR based reflector is coupled to the first optical waveguide optically downstream of the add-drop MRR; and
the third port of the second 1×2 optical coupler of the MRR based reflector is coupled to the second optical waveguide optically downstream of the add-drop MRR.

10. The light source of claim 3, wherein:
the optical coupler of the MRR based reflector comprises a 1×2 optical coupler including first, second, and third ports;
a further optical couple of the MRR based reflector comprises a 2×2 optical coupler including first, second, third, and fourth ports;
the first port of the 2×2 optical coupler is coupled to the WDM;
the second port of the 2×2 optical coupler outputs the combined light beam;
the third port of the 2×2 optical coupler outputs the narrow linewidth MW light;
the fourth port of the 2×2 optical coupler outputs further transmission MW light generated by the MRR based reflector, wherein the further transmission MW light comprises further narrow linewidth MW light output or is used to produce the further narrow linewidth MW light output, or is absorbed or dissipated;
the first port of the 1×2 optical coupler is configured to receive the combined light beam to be split;
the second port of the 1×2 optical coupler is coupled to the first optical waveguide of the add-drop MRR; and
the third port of the 1×2 optical coupler is coupled to the second optical waveguide of the add-drop MRR.

11. The light source of claim 1, wherein the MRR based reflector includes:
an add-drop MRR including first and second optical waveguides and an optical micro-ring positioned between the first and second optical waveguides; and
a loop mirror including first and second ports;
wherein the combined light beam from the WDM is coupled into the add-drop MRR via the first optical waveguide, and a portion of the combined light beam is dropped to the second optical waveguide and provided to the first port of the loop mirror;
wherein the loop mirror returns MW light to the second optical waveguide, via the first port of the loop mirror, and the returned MW light is added to the optical ring of the add-drop MRR, and dropped to the first optical waveguide to produce the reflection MW light beam generated by the MRR based reflector; and
wherein MW light that is output by the second port of the loop mirror is the transmission MW light generated by the MRR based reflector.

12. The MW light source of claim 11, wherein the add-drop MRR has a free spectral range (FSR) equal to a channel spacing of the WDM or equal to a subharmonic of the channel spacing of the WDM.

13. A method for producing narrow linewidth multi-wavelength (MW) light by a light source, comprising:
generating a plurality of light beams by a plurality of gain chips;
combining the plurality of light beams into a combined light beam;
generating, based on the combined light beam, both a reflection MW light beam and a transmission MW light beam;
separating the reflection MW light beam into a plurality of different wavelengths of light;
providing each of the different wavelengths of light to a respective one of the gain chips; and
outputting the narrow linewidth MW light based on the transmission MW light beam.

14. The method of claim 13, further comprising:
controlling a phase of each the different wavelengths of light before they are provided to a respective one of the gain chips.

15. The method of claim 13, wherein combining the plurality of light beams, and separating the reflection MW light beam, are performed using a wavelength division multiplexer (WDM).

16. The method of claim 15, wherein generating both the reflection MW light beam and the transmission MW light beam is performed by a micro-ring resonator (MRR) based reflector including an add-drop MRR having a free spectral range (FSR) equal to a channel spacing of the WDM or equal to a subharmonic of the channel spacing of the WDM.

17. The method of claim 13, wherein combining the plurality of light beams, generating both the reflection MW light beam and the transmission MW light beam, and separating the reflection MW light beam, are performed by components of a common chip to which the gain chips are coupled.

18. A light source that produces narrow linewidth multi-wavelength (MW) light, the light source comprising:
a plurality of gain chips;
a plurality of phase control sections;
a wavelength division multiplexer (WDM); and
a micro-ring resonator (MRR) based reflector including one or more optical couplers and an add-drop MRR;
the WDM coupled to each of the plurality of gain chips via a respective one of the plurality of phase control sections; and
the MRR based reflector configured to receive a combined light beam from the WDM and generate both a reflection MW light beam, which is returned to the WDM, and a transmission MW light beam, which is or is used to generate the narrow linewidth MW light.

19. The light source of claim 18, wherein:
each of the plurality of gain chips includes a laser cavity; and
each the different wavelengths of light is provided via a respective one of the phase control sections to a respective one of the gain chips to self seed the laser cavity of the respective one of the gain chips.

20. The light source of claim 18, wherein the WDM comprises an arrayed waveguide grating.

* * * * *